United States Patent
Zhong et al.

(10) Patent No.: US 12,412,488 B2
(45) Date of Patent: Sep. 9, 2025

(54) FOLDABLE ASSEMBLY AND FOLDABLE DISPLAY TERMINAL

(71) Applicant: HUAWEI TECHNOLOGIES CO., LTD., Guangdong (CN)

(72) Inventors: Ding Zhong, Dongguan (CN); Yong Liu, Dongguan (CN); Wen Fan, Dongguan (CN); Zhenlin Xiao, Dongguan (CN); Zhengxiong Lv, Dongguan (CN); Lexiong Peng, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 177 days.

(21) Appl. No.: 17/727,692

(22) Filed: Apr. 22, 2022

(65) Prior Publication Data

US 2022/0248548 A1    Aug. 4, 2022

Related U.S. Application Data

(63) Continuation of application No. PCT/CN2020/121980, filed on Oct. 19, 2020.

(30) Foreign Application Priority Data

Oct. 22, 2019  (CN) .......................... 201911008611.X

(51) Int. Cl.
*H05K 5/00*  (2025.01)
*G09F 9/30*  (2006.01)
(Continued)

(52) U.S. Cl.
CPC ............ *G09F 9/301* (2013.01); *H05K 5/0017* (2013.01); *H05K 5/0217* (2013.01); *H10K 50/84* (2023.02);
(Continued)

(58) Field of Classification Search
CPC ...... H05K 5/0017; H10K 50/84; H10K 59/12; H10K 77/111; H10K 2102/311;
(Continued)

(56) References Cited

U.S. PATENT DOCUMENTS 9,572,272 B2    2/2017  Lee et al.
9,696,763 B2    7/2017  Mok et al.
(Continued)

FOREIGN PATENT DOCUMENTS

CN    102597904 A    7/2012
CN    103778858 A    5/2014
(Continued)

*Primary Examiner* — Allen L Parker
*Assistant Examiner* — Dakota M Talbert

(57) ABSTRACT

A foldable assembly which is configured to bear a flexible display. The foldable assembly includes a rotating shaft; a first mechanical part and a second mechanical part, where the first mechanical part and the second mechanical part are rotatably connected by using the rotating shaft; and a first protective structure, where the first protective structure is connected to an end face that is of the rotating shaft and that extends out of a periphery of the flexible display. A first surface of the flexible display is away from the rotating shaft, and the first protective structure is higher than or flush with the first surface of the flexible display, so that when the foldable display terminal falls, the first protective structure is in contact with a point of collision earlier than the flexible display.

23 Claims, 15 Drawing Sheets

(51) Int. Cl.
  *H05K 5/02*       (2006.01)
  *H10K 50/84*      (2023.01)
  *H10K 59/12*      (2023.01)
  *H10K 77/10*      (2023.01)
  *H10K 102/00*     (2023.01)

(52) U.S. Cl.
  CPC .......... *H10K 59/12* (2023.02); *H10K 77/111* (2023.02); *H10K 2102/311* (2023.02)

(58) Field of Classification Search
  CPC .... G06F 1/1637; G06F 1/1641; G06F 1/1652; G06F 1/1656; G06F 1/1681; H04M 1/0214; H04M 1/0268; H04M 1/185
  See application file for complete search history.

(56) References Cited

U.S. PATENT DOCUMENTS

| | | | | |
|---|---|---|---|---|
| 10,440,840 | B2* | 10/2019 | Ochi | H05K 5/0226 |
| 2017/0227994 | A1 | 8/2017 | Hsu | |
| 2018/0110139 | A1* | 4/2018 | Seo | E05D 7/00 |
| 2019/0036068 | A1* | 1/2019 | Kim | G06F 1/1601 |
| 2019/0132974 | A1* | 5/2019 | Chen | G06F 1/1616 |
| 2019/0268456 | A1 | 8/2019 | Park et al. | |

FOREIGN PATENT DOCUMENTS

| | | | |
|---|---|---|---|
| CN | 107102692 | A | 8/2017 |
| CN | 107135288 | A | 9/2017 |
| CN | 107146527 | A | 9/2017 |
| CN | 107547700 | A | 1/2018 |
| CN | 108076171 | A | 5/2018 |
| CN | 108508967 | A | 9/2018 |
| CN | 108769317 | A | 11/2018 |
| CN | 108874048 | A | 11/2018 |
| CN | 109257460 | A | 1/2019 |
| CN | 109462674 | A | 3/2019 |
| CN | 109600466 | A | 4/2019 |
| CN | 208806015 | U | 4/2019 |
| CN | 109788137 | A | 5/2019 |
| CN | 109799877 | A | 5/2019 |
| CN | 109830185 | A | 5/2019 |
| CN | 110784567 | A | 2/2020 |
| EP | 3264732 | A1 | 1/2018 |
| EP | 3282341 | A1 | 2/2018 |
| EP | 3467325 | A1 | 4/2019 |
| JP | 2019520528 | A | 7/2019 |
| KR | 20110038558 | A | 4/2011 |
| KR | 20130062210 | A | 6/2013 |
| KR | 101894456 | B1 | 9/2018 |

* cited by examiner

FOLDABLE ASSEMBLY AND FOLDABLE DISPLAY TERMINAL

CROSS-REFERENCE TO RELATED APPLICATIONS

This application is a continuation of International Application No. PCT/CN2020/121980, filed on Oct. 19, 2020, which claims priority to Chinese Patent Application No. 201911008611.X, filed on Oct. 22, 2019. The disclosures of the aforementioned applications are hereby incorporated by reference in their entireties.

TECHNICAL FIELD

This application relates to the field of display technologies, and in particular, to a foldable assembly and a foldable display terminal.

BACKGROUND

With continuous development of display technologies, a foldable display terminal gradually becomes a development trend of future mobile electronic products. When the foldable display terminal is unfolded, a large display area improves a video watching effect. When the foldable display terminal is folded, a small size makes the terminal convenient for a user to carry.

The foldable display terminal includes at least a flexible display and a foldable assembly configured to bear the flexible display. The flexible display is fragile, and is easy to damage and fail.

When the foldable display terminal is being used, however, the foldable display terminal often falls, and consequently, the flexible display of the terminal is damaged. This is especially a problem for a foldable display terminal having an outwardly-foldable design. Because the foldable display is on an outer surface, the display is exposed and a likelihood of damage caused by a fall is increased affecting a user experience.

SUMMARY

Embodiments of this application provide a foldable assembly and a foldable display terminal, to resolve a problem that a flexible display is damaged due to a fall of the foldable display terminal and user experience is affected.

To achieve the foregoing objective, the following technical solutions are used in embodiments of this application. According to a first aspect of embodiments of this application, a foldable assembly is provided. The foldable assembly is configured to bear a flexible display, and the foldable assembly includes: a rotating shaft; a first mechanical part and a second mechanical part, where the first mechanical part and the second mechanical part are rotatably connected by using the rotating shaft; and a first protective structure, where the first protective structure is connected to an end face that is of the rotating shaft and that extends out of a periphery of the flexible display, the flexible display includes a first surface that is away from the rotating shaft, and the first protective structure is higher than or flush with the first surface of the flexible display. Therefore, the first protective structure is disposed, to protect the flexible display, and avoid a case in which the flexible display is damaged due to a fall of a foldable display terminal. In a plurality of fall forms, the flexible display is most easily damaged when the foldable display terminal in a folded state falls at an angle. When the foldable display terminal is in the folded state, the first protective structure provided in this embodiment of this application is located at a bending angle of the flexible display, and the first protective structure is higher than or flush with a surface that is of the flexible display and that is away from the bent region support, so that when the foldable display terminal falls, the first protective structure is in contact with a point of collision earlier than the flexible display, to enhance protection of the flexible display and further improve anti-collision performance of the foldable display terminal.

In an optional implementation, a material of the first protective structure is stainless steel, die steel, or an amorphous alloy. Therefore, strength of the first protective structure is improved, and the anti-collision performance of the foldable display terminal is improved.

In an optional implementation, the first protective structure and the rotating shaft are integrally formed. Therefore, a connection manner in which the first protective structure and the rotating shaft are integrally formed provides higher strength, and the anti-collision performance of the foldable display terminal is further improved.

In an optional implementation, the foldable assembly further includes a second protective structure and a third protective structure. The second protective structure is connected to an end face that is of the first mechanical part and that extends out of the periphery of the flexible display, and the second protective structure is higher than or flush with a surface that is of the flexible display and that is away from the first mechanical part; and the third protective structure is connected to an end face that is of the second mechanical part and that extends out of the periphery of the flexible display, and the third protective structure is higher than or flush with a surface that is of the flexible display and that is away from the second mechanical part. Therefore, the second protective structure and the third protective structure are disposed, to protect the periphery of the flexible display. In addition, the second protective structure and the third protective structure are higher than or flush with the surface that is of the flexible display and that is away from the second mechanical part. When a fall or a collision occurs, the second protective structure and the third protective structure may be in contact with the point of collision earlier than the flexible display, to enhance the protection of the flexible display, and further improve the anti-collision performance of the foldable display terminal.

In an optional implementation, the second protective structure and the first mechanical part are integrally formed, and the third protective structure and the second mechanical part are integrally formed. Therefore, a connection manner in which the second protective structure and the first mechanical part are integrally formed provides higher strength, and the anti-collision performance of the foldable display terminal is further improved.

In an optional implementation, a material of each of the second protective structure and the third protective structure is an aluminum alloy. Therefore, strength of the first protective structure is improved, and the anti-collision performance of the foldable display terminal is improved.

In an optional implementation, a first protrusion is disposed on the first mechanical part, a first groove matching the first protrusion is disposed on the rotating shaft, and the first protrusion is located in the first groove; and a second protrusion is disposed on the second mechanical part, a second groove matching the second protrusion is disposed on the rotating shaft, and the second protrusion is located in the second groove. Therefore, the first groove matches the first protrusion, and the second groove matches the second protrusion, so that when the foldable display terminal falls, displacement and dislocation amounts of the first mechanical part and the second mechanical part relative to the rotating shaft can be greatly reduced, and a case in which the flexible display is damaged by shear force exerted on the flexible display due to a fall of the foldable display terminal is avoided.

In an optional implementation, the foldable assembly further includes: a third mechanical part, where the first mechanical part is provided with a first sliding groove, a first end of the third mechanical part is connected to the rotating shaft, and a second end of the third mechanical part is disposed in the first sliding groove; and a fourth mechanical part, where the second mechanical part is provided with a second sliding groove, a first end of the fourth mechanical part is connected to the rotating shaft, and a second end of the fourth mechanical part is disposed in the second sliding groove. Therefore, the third mechanical part is slidably connected to the first mechanical part, and the fourth mechanical part is slidably connected to the second mechanical part, so that when the flexible display is folded or unfolded, the first mechanical part can slide relative to the third mechanical part, and the second mechanical part can slide relative to the fourth mechanical part, to reduce pulling force exerted by the first mechanical part, the second mechanical part, and the rotating shaft on the flexible display, avoid a case in which the flexible display is damaged when being pulled, and improve flatness of the flexible display.

In an optional implementation, the foldable display terminal further includes: a bent region support, located on a side that is of a rotating part and that faces the flexible display, and connected to the rotating shaft, the first mechanical part, and the second mechanical part, where the bent region support includes a flexible connection layer and a plurality of spaced rigid support bars disposed along an axis direction of the rotating shaft; the rigid support bar is connected to the flexible connection layer; and the flexible connection layer is connected to a bent region of the flexible display by using an adhesive layer. Therefore, the bent region support may be flexible to an extent because of a flexible material layer, to ensure that a maximum bending angle of the bent region of the flexible display can meet a requirement, and the rigid support bar can provide strong rigidity for the bent region support, so that the bent region support has good support performance, and an impact resistance capability of the bent region of the flexible display in a bending process of the foldable display terminal is improved.

In an optional implementation, an elastic component is disposed between an end face of the bent region support and the first protective structure. Therefore, the elastic component is disposed between the bent region support and the first protective structure, to cushion the fall of the foldable display terminal, and protect the bent region support.

According to a second aspect of embodiments of this application, a foldable display terminal is provided, including a flexible display and the foregoing foldable assembly. A first non-bent region of the flexible display is connected to a first mechanical part in the foldable assembly; a second non-bent region of the flexible display is connected to a second mechanical part in the foldable assembly; a bent region of the flexible display is connected to a bent region support in the foldable assembly; and the bent region is located between the first non-bent region and the second non-bent region. Therefore, the foldable assembly is used by the foldable display terminal, to improve anti-collision performance of the foldable display terminal.

BRIEF DESCRIPTION OF DRAWINGS

FIG. 3b is a cutaway drawing of A-A in FIG. 3a;

DESCRIPTION OF EMBODIMENTS

To make the objectives, technical solutions, and advantages of this application clearer, the following further describes this application in detail with reference to the accompanying drawings.

The following terms "first", "second", and the like are merely intended for a purpose of description, and shall not be understood as an indication or implication of relative importance or implicit indication of a quantity of indicated technical features. Therefore, a feature limited by "first", "second", or the like may explicitly or implicitly include one or more features. In the description of this application, unless otherwise stated, "a plurality of" means two or more than two.

In addition, in this application, directional terms such as "top" and "bottom" are defined relative to directions of components in the accompanying drawings. It should be understood that these directional terms are relative concepts used for relative description and clarification, and may correspondingly change based on changes in the directions of the components in the accompanying drawings.

An embodiment of this application provides a foldable display terminal. The foldable display terminal may be a product having a display screen, such as a mobile phone, a display, a tablet computer, or a vehicle-mounted computer. A specific form of the foldable display terminal is not particularly limited in this embodiment of this application.

Figure 1:
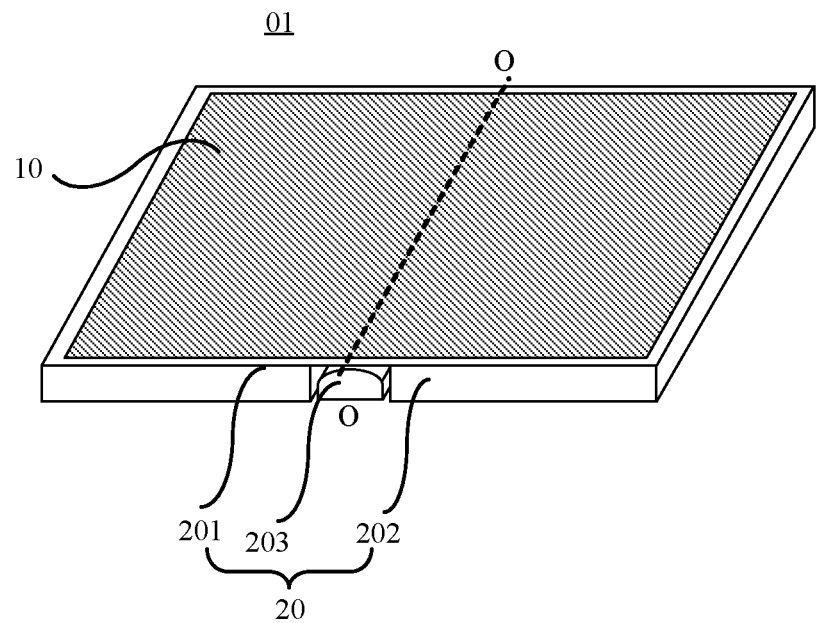
FIG. 1 is a schematic diagram of a structure of a foldable display terminal in the conventional technology.

To facilitate understanding of the foldable display terminal provided in this embodiment of this application, the following describes an existing foldable display terminal with reference to FIG. 1.

As shown in FIG. 1, a foldable display terminal 01 includes a flexible display 10. The flexible display 10 may be an active matrix organic light emitting diode (active matrix organic light emitting diode, AMOLED) display.

Because the AMOLED display is a self-luminous display, a back light module (back light module, BLM) is not required to be disposed in the AMOLED display. Therefore, when a base substrate of the AMOLED display is made from a flexible resin material, for example, polyethylene terephthalate (polyethylene terephthalate, PET), the AMOLED display may be bendable.

In addition, as shown in FIG. 1, the foldable display terminal 01 further includes a foldable assembly 20 configured to bear the flexible display 10.

The foldable assembly 20 includes a first mechanical part 201, a second mechanical part 202, and a rotating shaft 203 located between the first mechanical part 201 and the second mechanical part 202.

The rotating shaft 203 is connected to the first mechanical part 201 and the second mechanical part 202. The first mechanical part 201 and the second mechanical part 202 may separately rotate around the rotating shaft 203. The first mechanical part 201 and the second mechanical part 202 may be housings, or may be middle frame structures of an electronic device.

The first mechanical part 201 and the second mechanical part 202 may be configured to bear the flexible display 10, so that the flexible display 10 remains as flat as possible in a use process, and a non-display surface of the flexible display 10 is protected.

A part of the flexible display 10 is fastened on the first mechanical part 201 by using an adhesive layer, a part of the flexible display 10 is fastened on the second mechanical part 202 by using an adhesive layer, and the remaining part of the flexible display 10 is located between the first mechanical part 201 and the second mechanical part 202. The adhesive layer may be a thin film layer formed after an adhesive is applied. A specific form of the adhesive layer is not limited in this embodiment of this application. In addition, another electronic element such as a camera, a headset, a receiver, a button, or a battery may be disposed on the first mechanical part 201 and the second mechanical part 202. The another electronic element disposed on the first mechanical part 201 and the second mechanical part 202 are not limited in this embodiment of this application.

Figure 1A:
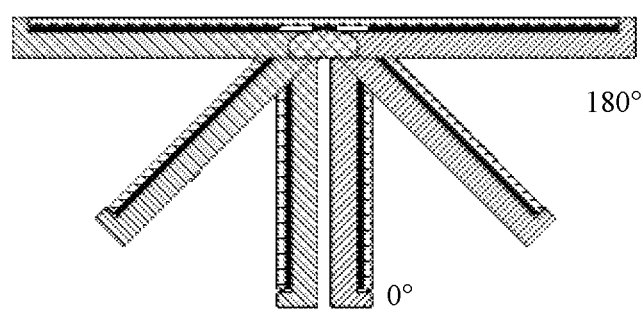
FIG. 1a is a diagram of a use state of the foldable display terminal in FIG. 1.

The first mechanical part 201 and the second mechanical part 202 may rotate along an axis O-O of the rotating shaft 203, to drive the flexible display 10 to be folded or unfolded. As shown in FIG. 1a, the flexible display may be folded or unfolded. FIG. 1a shows an unfolding process of unfolding the flexible display from 180° to 0°, or a folding process of folding the flexible display from 0° to 180°.

Figure 1B:
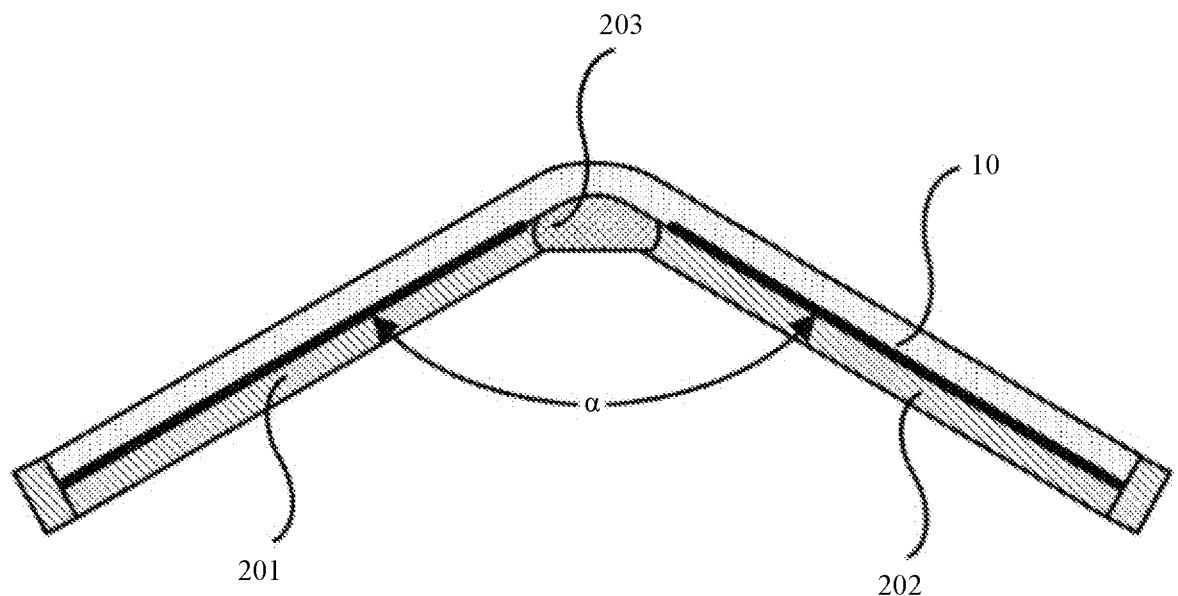
FIG. 1b is a diagram of a bent state of the foldable display terminal in FIG. 1.

As shown in FIG. 1b, when an included angle α between the first mechanical part 201 and the second mechanical part 202 is 0°, the flexible display 10 is in a folded state.

Figure 1C:
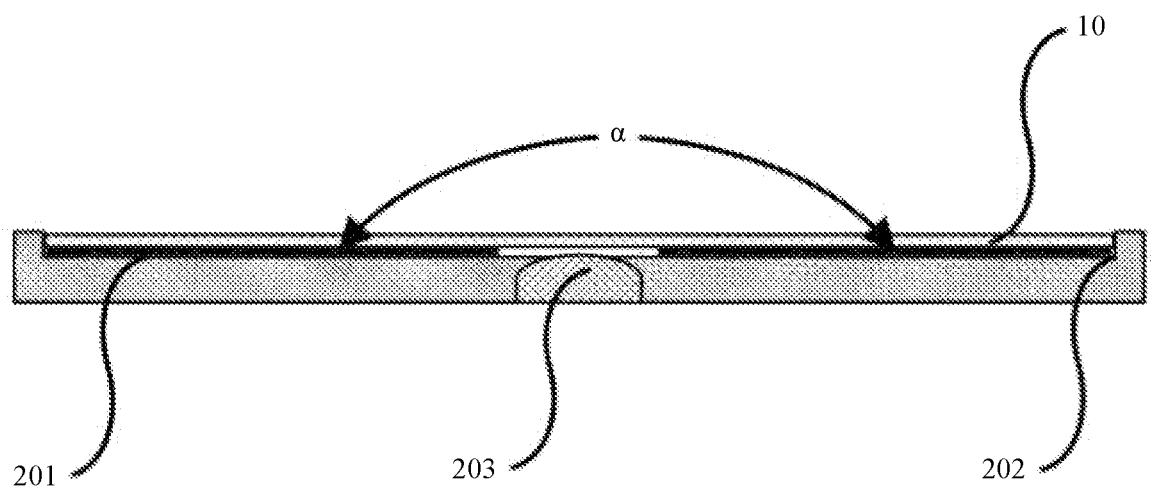
FIG. 1c is a diagram of an unfolded state of the foldable display terminal in FIG. 1.

Alternatively, as shown in FIG. 1c, when an included angle α between the first mechanical part 201 and the second mechanical part 202 is increased to 180°, the flexible display 10 is in an unfolded state.

When the first mechanical part 201 and the second mechanical part 202 are not bendable, an area, of the flexible display 10, that is connected to the first mechanical part 201 by using the adhesive layer cannot be bent. The area is a first non-bent area 101 shown in FIG. 2.

An area, of the flexible display 10, that is connected to the second mechanical part 202 by using the adhesive layer, cannot be bent under support of the second mechanical part 202. The area is a second non-bent area 102 shown in FIG. 2.

In addition, a part, of the flexible display 10, that is located between the first non-bent area 101 and the second non-bent area 102 is a bent area 103 that can enable the foldable display terminal 01 to be bent.

Figure 2:
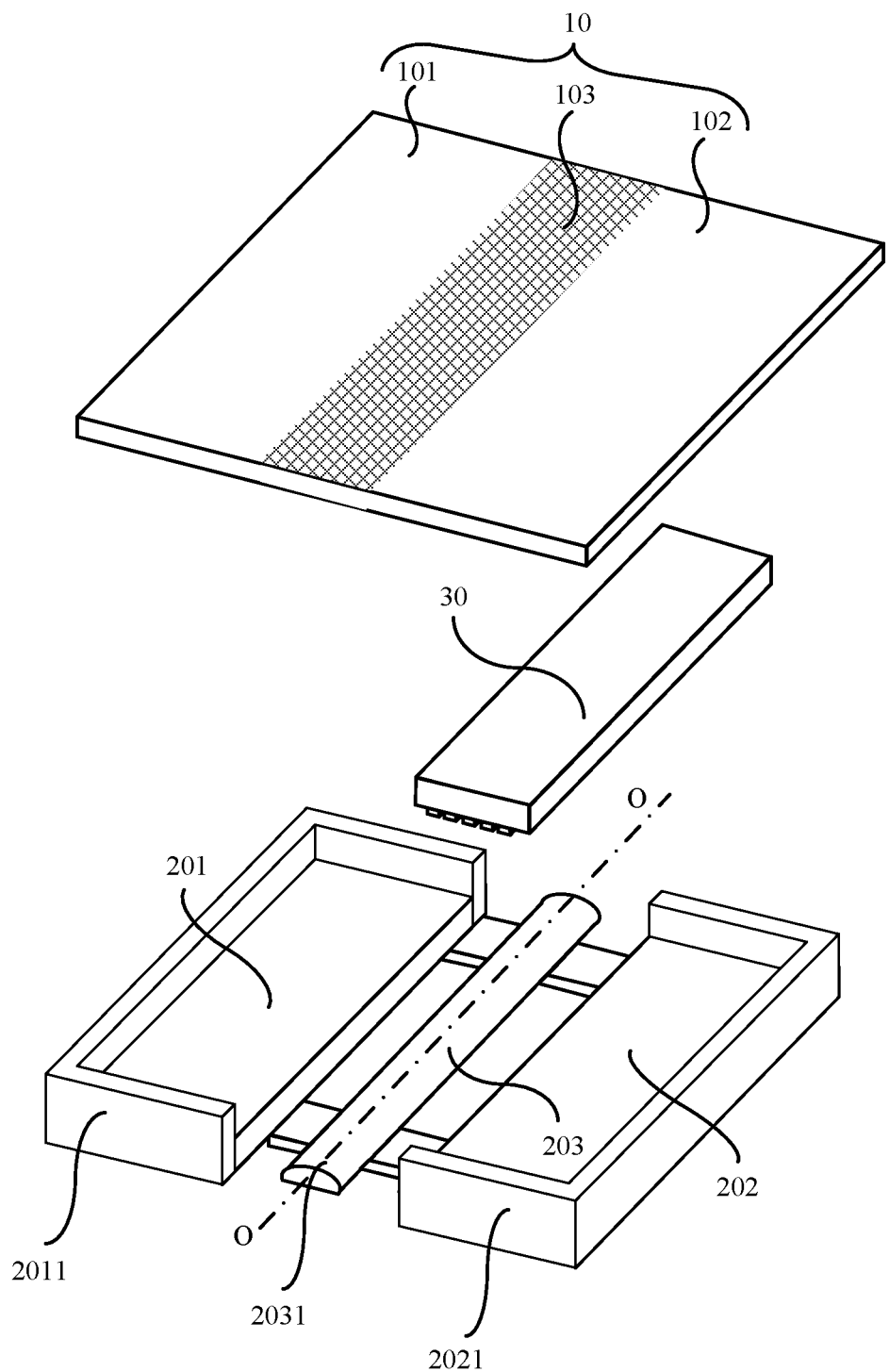
FIG. 2 is a schematic diagram of an exploded structure of a foldable display terminal according to an embodiment of this application.

Based on this, to support the bent area 103 of the flexible display 10, improve rigidity and impact resistance of the bent area 103, and ensure that bending performance of the bent area 103 of the flexible display 10 can meet a requirement, as shown in FIG. 2, the foldable assembly 20 further includes a bent region support 30.

The bent region support 30 is located on a side, facing the flexible display 10, of the rotating shaft 203. The bent region support 30 is further connected to the first mechanical part 201 and the second mechanical part 202.

For example, one end that is of the bent region support 30 and that is close to the first mechanical part 201 may be bonded to the first mechanical part 201 by using an adhesive layer.

One end that is of the bent region support 30 and that is close to the second mechanical part 202 may be bonded to the second mechanical part 202 by using an adhesive layer.

In addition, a middle area of the bent region support 30, other than a part connected to the first mechanical part 201 and the second mechanical part 202, is connected to the rotating shaft 203.

It should be noted that a manner of connecting the bent region support 30 to the rotating shaft 203 is not limited in this application.

It may be learned from the foregoing description that, on one hand, the bent region support 30 needs to support the bent area 103, so that in a bending process of the foldable display terminal 01, the bent area 103 of the flexible display 10 has a good impact resistance capability, and a probability that the flexible display 10 is damaged in the bent area 103 is reduced.

On the other hand, the bent region support 30 further needs to have good flexibility, to ensure that a maximum bending angle of the bent area 103 of the flexible display 10 can meet a requirement. For example, when the bent area 103 of the flexible display 10 and the bent region support 30 are at a maximum bending angle, it can be ensured that a rear face of the first mechanical part 201 (a surface at one side away from the flexible display 10) is in contact with a rear face of the second mechanical part 202.

Figure 2A:
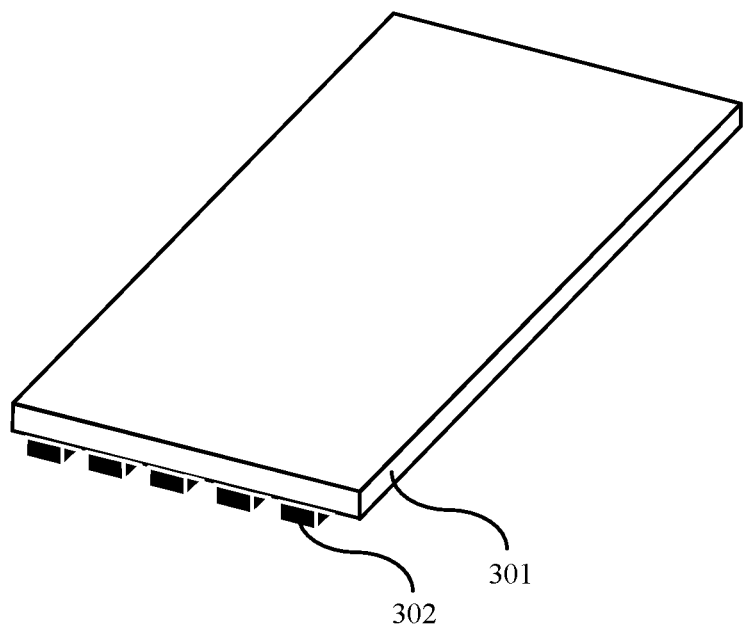
FIG. 2a is a schematic diagram of a structure of a bent region support according to an embodiment of this application.

To meet the foregoing requirement, in some embodiments of this application, as shown in FIG. 2 and FIG. 2a, the bent region support 30 includes a flexible connection layer 301, and a plurality of spaced rigid support bars 302 that are disposed along a direction of the axis O-O of the rotating shaft 203. The plurality of rigid support bars 302 are disposed at intervals, and each rigid support bar 302 is connected to the flexible connection layer 301.

Figure 2B:
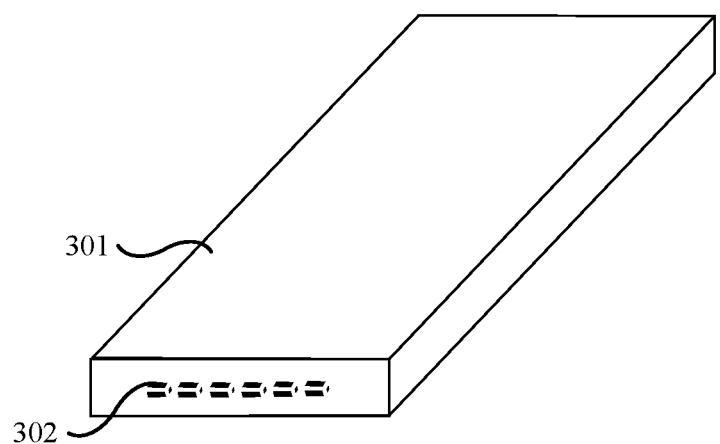
FIG. 2b is a schematic diagram of a structure of another bent region support according to an embodiment of this application.

Alternatively, for another example, in some other embodiments of this application, as shown in FIG. 2b, the flexible connection layer 301 wraps the plurality of rigid support bars 302. In this case, a periphery of each rigid support bar 302 is covered by the flexible connection layer 301.

Rigidity of a material constituting the rigid support bar 302 is greater than rigidity of a material constituting the flexible connection layer 301.

For example, a material of the rigid support bar 302 may be a metal simple substance, for example, tungsten or molybdenum; or may be a metal compound, for example, alloy steel such as stainless steel or die steel, or an amorphous alloy.

The material constituting the flexible connection layer 301 may be a silicone material with high flexibility. In this way, the flexible connection layer 301 may enable the bent region support 30 to be flexible, to ensure that the maximum bending angle of the bent area 103 of the flexible display 10 can meet the requirement.

In addition, the rigid support bars 302 may provide strong rigidity for the bent region support 30, so that the bent region support 30 has good support performance, to improve the impact resistance capability of the bent area 103 of the flexible display 10 in the bending process of the foldable display terminal 01.

The flexible display 10 is fragile, and the flexible display 10 is prone to damage when the foldable display terminal falls. In addition, in a plurality of fall forms, the flexible display is most easily damaged when the foldable display terminal that is of an outward-foldable design and that is in a folded state falls at an angle. When the foldable display terminal of the outward-foldable design is in the folded state, the flexible display is located on an outside of the device.

To avoid a case in which the flexible display 10 is damaged when the foldable display terminal falls, the flexible display 10 needs to be provided with a protective structure.

In an implementation of this application, as shown in FIG. 3, FIG. 3a, FIG. 3b, FIG. 3c, FIG. 4, and FIG. 5, a protective structure 303 may be disposed on an end face that is of the bent region support 30 and that extends out of a periphery of the flexible display 10. The protective structure 303 separately extends from the end face of the bent region support 30 to an end face of the flexible display 10 and an end face of the rotating shaft 203, and the protective structure 303 and the bent region support 30 are arranged in a shape "T".

Therefore, the protective structure 303 is disposed, to protect the bent area 103 of the flexible display, and avoid a case in which the flexible display is damaged when the foldable display terminal falls.

In addition, when the foldable display terminal is in the folded state, the protective structure 303 provided in this embodiment of this application is located at a bending angle of the flexible display, to protect the bending angle of the flexible display, and in particular, protect, in a case of a fall at an angle, the foldable display terminal that is of the outward-foldable design and that is in the folded state, and improve anti-collision performance of the foldable display terminal.

For example, the protective structure 303 is higher than or flush with a surface that is of the flexible display 10 and that is away from the bent region support 30, so that when the foldable display terminal falls, the protective structure 303 is in contact with a point of collision earlier than the flexible display, to enhance protection of the flexible display, and further improve anti-collision performance of the foldable display terminal.

A connection manner of the protective structure 303 and the bent region support 30 is not limited in this embodiment of this application. In an implementation of this application, for example, the protective structure 303 and the bent region support 30 are separately formed, and the protective structure 303 and the rigid support bar 302 of the bent region support 30 may be connected through welding.

In another implementation of this application, for example, the protective structure 303 and the rigid support bar 302 of the bent region support 30 are integrally formed. In this case, strength of a connection point of the protective structure 303 and the bent region support 30 can be increased.

A material of the protective structure 303 is not limited in this embodiment of this application. For example, the material of the protective structure 303 includes but is not limited to alloy steel such as stainless steel or die steel, or an amorphous alloy. The protective structure 303 may be injection molded by using a metal injection molding (Metal injection Molding, MIM) process. During molding, metal powder and a plasticized compound of a binder may be mixed first, and then a mixture is granulated and then injected to obtain a desired shape.

However, there are a plurality of rigid support bars 302, and a single rigid support bar has a small dimension and low strength. A quantity of protective structures 303 is the same as a quantity of rigid support bars 302, and one protective structure 303 is connected to an end face of each rigid support bar. There is a complex process.

Figure 4:
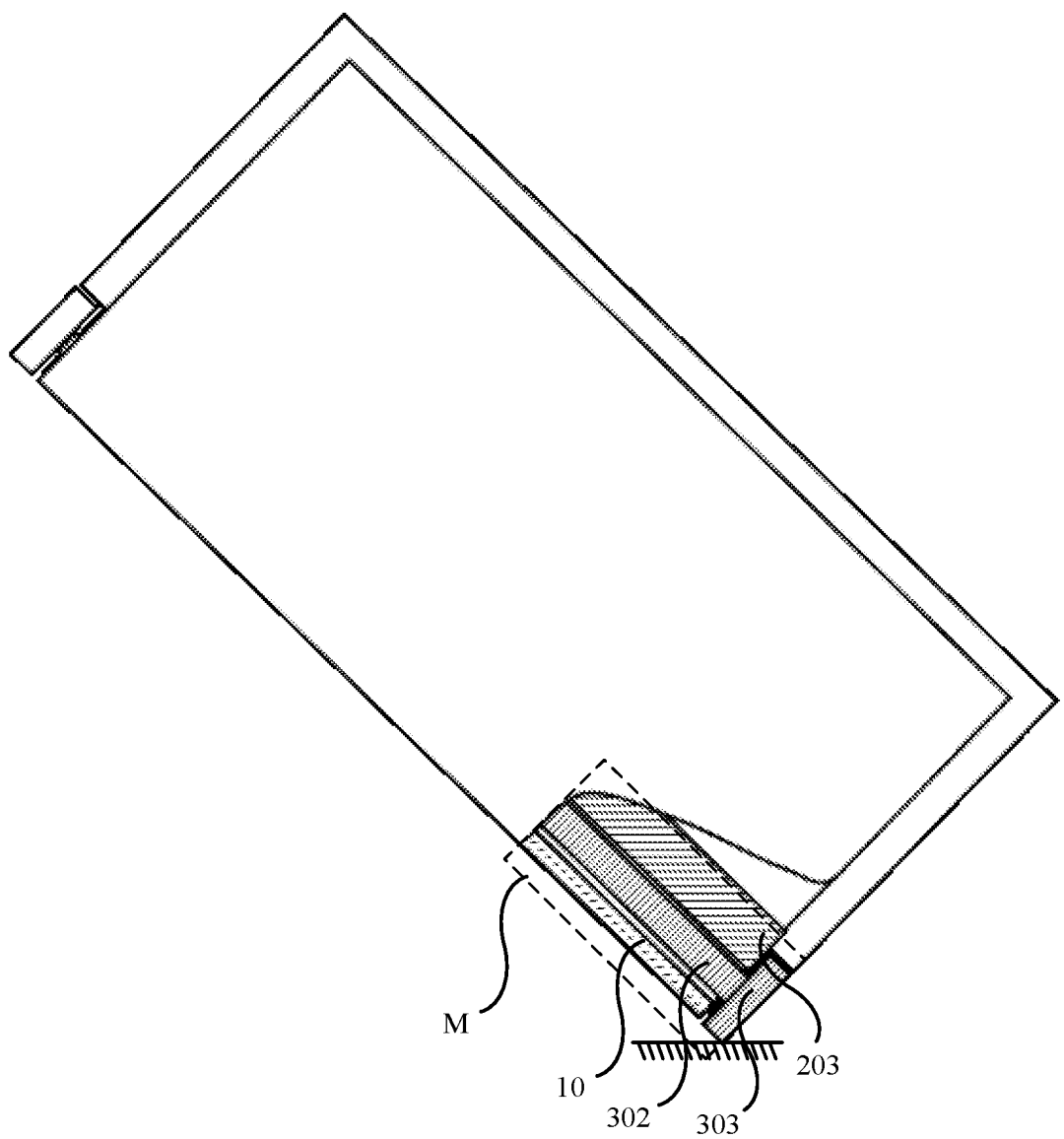
FIG. 4 is a schematic diagram of a falling state of the foldable display terminal in FIG. 3.
Figure 5:
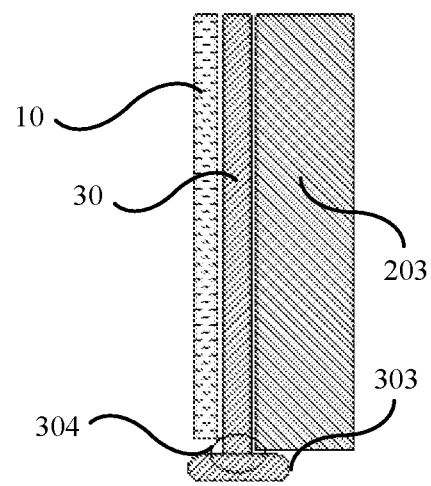
FIG. 5 is a locally enlarged diagram of M in FIG. 4.

In addition, as shown in FIG. 4, when the foldable display terminal falls at an angle, the protective structure 303 and the single rigid support bar 302 are subjected to impact, and deformation or a fracture is prone to occur at a location at which the protective structure 303 and the single rigid support bar 302 cross in a shape of "T", namely, at a location 304 in FIG. 5. Consequently, there is a problem that the flexible display performs abnormal display after the foldable display terminal falls, and the problem is particularly prominent for a device whose flexible display is of an outward-foldable design.

To further improve protection of the protective structure 303 for the flexible display 10, a part that is of the rigid support bar 302 and that is subjected to impact of a fall may be strengthened, or the rotating shaft is used to assist in limiting on a rear side of the rigid support bar 302, to share a part of the impact of a fall, or as shown in FIG. 5, a gap between the flexible display 10 and the protective structure 303 is increased, to leave a large safety margin.

However, due to a limited dimension of the rigid support bar 302, structural strength of the rigid support bar 302 cannot be improved without a restriction. Although the rotating shaft shares a part of the impact of a fall on the rear side of the rigid support bar 302, total impact energy is too large, and the remaining impact energy still causes the rigid support bar 302 to break or deform. In addition, there is a too large gap between the flexible display 10 and the protective structure 303, and there is an unaesthetic appearance.

Therefore, an embodiment of this application further provides a protective structure of a flexible display.

As shown in FIG. 6, FIG. 6a, FIG. 6b, FIG. 7, and FIG. 8, a difference between the protective structure in this embodiment and the protective structure 303 provided on the end face of the bent region support 30 is that a first protective structure 2031 in this embodiment is disposed on an end face that is of the rotating shaft 203 and that extends from the periphery of the flexible display 10, and the first protective structure 2031 extends from the end of the rotating shaft 203 to the end face of the flexible display 10, so that the first protective structure 2031 and the rotating shaft 203 are arranged in a shape of "L".

Therefore, the first protective structure 2031 is disposed, to protect the bent area 103 of the flexible display, and avoid a case in which the flexible display is damaged when the foldable display terminal falls.

When the foldable display terminal is in the folded state, the first protective structure 2031 provided in this embodiment of this application is located at the bending angle of the flexible display, to protect the bending angle of the flexible display, and in particular, protect the foldable display terminal in the folded state in a case of the fall at an angle, and improve anti-collision performance of the foldable display terminal.

The first protective structure 2031 is higher than or flush with the surface that is of the flexible display 10 and that is away from the bent region support 30, so that when the foldable display terminal falls, the first protective structure 2031 is in contact with a point of collision earlier than the flexible display, to enhance protection of the flexible display, and further improve anti-collision performance of the foldable display terminal.

Figure 8:
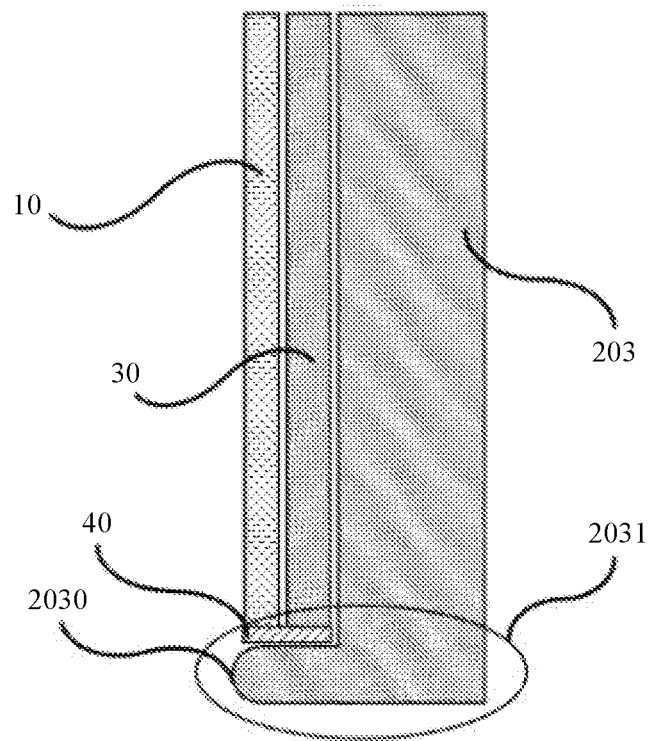
FIG. 8 is a locally enlarged diagram of N in FIG. 7.

It should be noted that a dimension of the first protective structure is not limited in this embodiment of this application. As shown in FIG. 8, a vertex 2030 of the first protective structure 2031 is first in contact with the ground in a fall, and is subjected to greatest impact. Therefore, an area or a thickness of the vertex 2030 may be properly increased, or a dimension of the entire first protective structure 2031 is adjusted to increase a force receiving area, to improve impact resistance performance of the foldable display terminal.

A connection manner of the first protective structure 2031 and the rotating shaft 203 is not limited in this embodiment of this application. In an implementation of this application, for example, a material of the first protective structure 2031 is the same as a material of the rotating shaft 203. The first protective structure 2031 and the rotating shaft 203 may be separately formed first, and then the first protective structure 2031 and the rotating shaft 203 are connected through welding.

In another implementation of this application, for example, the first protective structure 2031 and the rotating shaft 203 are integrally formed. Therefore, strength of a connection point of the first protective structure 2031 and the rotating shaft 203 can be improved.

A material of the first protective structure 2031 is not limited in this embodiment of this application. For example, the material of the first protective structure 2031 includes but is not limited to alloy steel such as stainless steel or die steel, or an amorphous alloy. The first protective structure 2031 may be injection molded by using a metal injection molding (Metal injection Molding, MIM) process. During molding, metal powder and a plasticized compound of a binder may be mixed first, and then a mixture is granulated and then injected to obtain a desired shape.

In comparison with the protective structure 303 in the foregoing embodiment, a part that is of the first protective structure 2031 in this embodiment and that is subjected to impact of a fall changes from the protective structure 303 on the rigid support bar 302 to the first protective structure 2031 on the rotating shaft 203.

In the foregoing embodiment, a connection location of the protective structure 303 and the rigid support bar 302 is a weakest point of strength of a part that is of the foldable display terminal and that is subjected to impact. In this embodiment, a connection location of the first protective structure 2031 and the rotating shaft 203 is a weakest point of strength of the part that is of the foldable display terminal and that is subjected to impact. A dimension of a connection face of the first protective structure 2031 and the rotating shaft 203 is greater than a dimension of a connection face of the protective structure 303 and the rigid support bar 302, to help improve impact resistance performance of the foldable display terminal.

Figure 9:
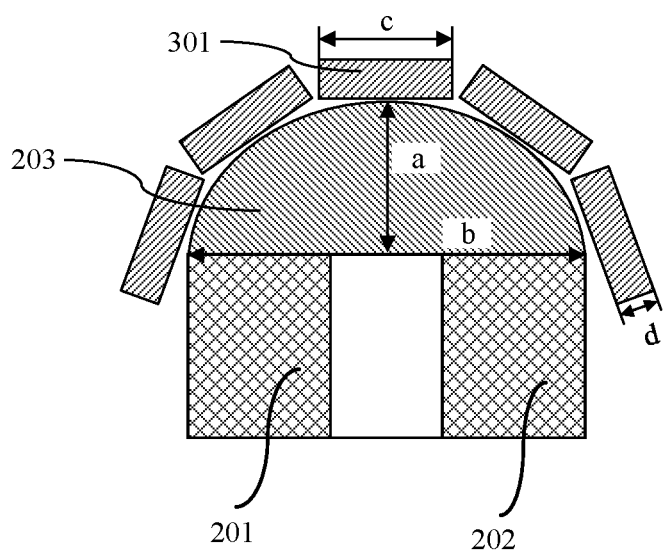
FIG. 9 is a cutaway drawing of B-B in FIG. 7.

The following provides detailed descriptions with reference to FIG. 9.

In the foregoing embodiment, the dimension of the connection face of the protective structure 303 and the rigid support bar 302 and a cross-sectional dimension of the rigid support bar 302 may be represented as c*d. In this embodiment, the dimension of the connection face of the first protective structure 2031 and the rotating shaft 203 and a cross-sectional dimension of the rotating shaft 203 may be represented as a*b. Because the rotating shaft 203 does not need to be folded following the flexible display, the cross-sectional dimension a*b of the rotating shaft 203 is larger than the cross-sectional dimension c*d of the rigid support bar.

Usually, there are a plurality of rigid support bars. For example, as shown in FIG. 2, there are five rigid support bars. Certainly, there may be seven or more rigid support bars, and there is a gap between the rigid support bars. The dimension of the connection face of the first protective structure 2031 and the rotating shaft 203 is approximately 5 to 6 times of the dimension of the connection face of the protective structure 303 and the rigid support bar 302, and strength of the rotating shaft 203 is approximately 5 to 6 times of strength of the rigid support bar in a case of a same material, to greatly improve anti-collision performance in a fall.

Therefore, in the foldable assembly provided in this embodiment of this application, the first protective structure connected to the rotating shaft 203 is disposed. In comparison with the protective structure connected to the rigid support bar of the bent region support 30 in the foregoing embodiment, strength of the part that is subjected to impact is increased by 5 to 6 times in the fall at an angle, to avoid a case in which the flexible display is damaged due to a fracture and deformation of the part.

Figure 7:
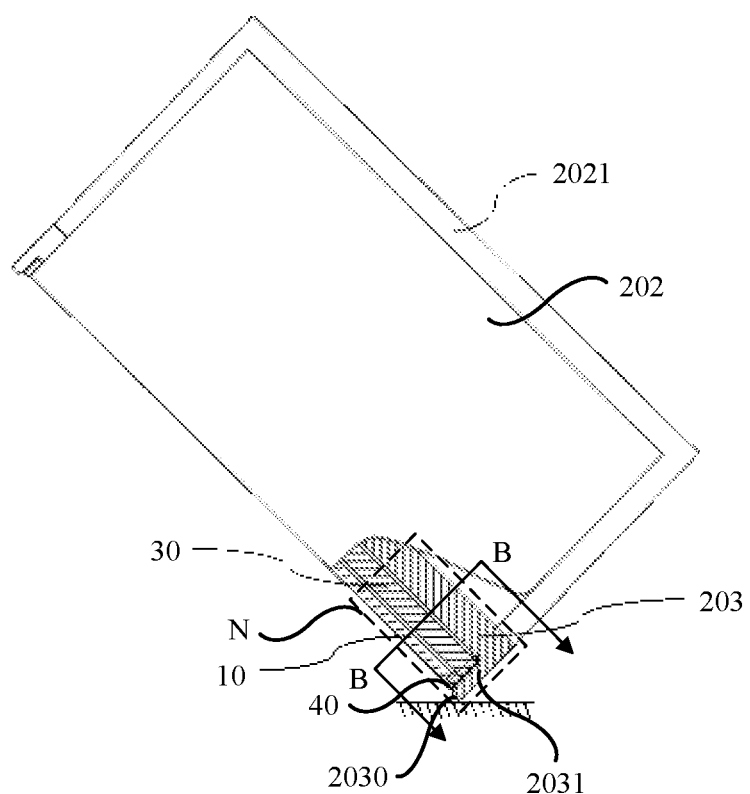
FIG. 7 is a schematic diagram of a falling state of the foldable display terminal in FIG. 6.

Then refer to FIG. 7. The end face of the bent region support 30 may be retracted, and an elastic component 40 is disposed between the end face of the bent region support and the first protective structure 2031. A material of the elastic component includes but is not limited to silica gel.

Therefore, the elastic component is disposed, to cushion a fall. In addition, the end face of the bent region support 30 is retracted, and the first protective structure 2031 is disposed outside the bent region support. There is only one first protective structure 2031. In comparison with a case of a plurality of protective structures 303 in the foregoing embodiment, there is a simpler process, and a manufacturing yield can be greatly improved.

Figure 3:
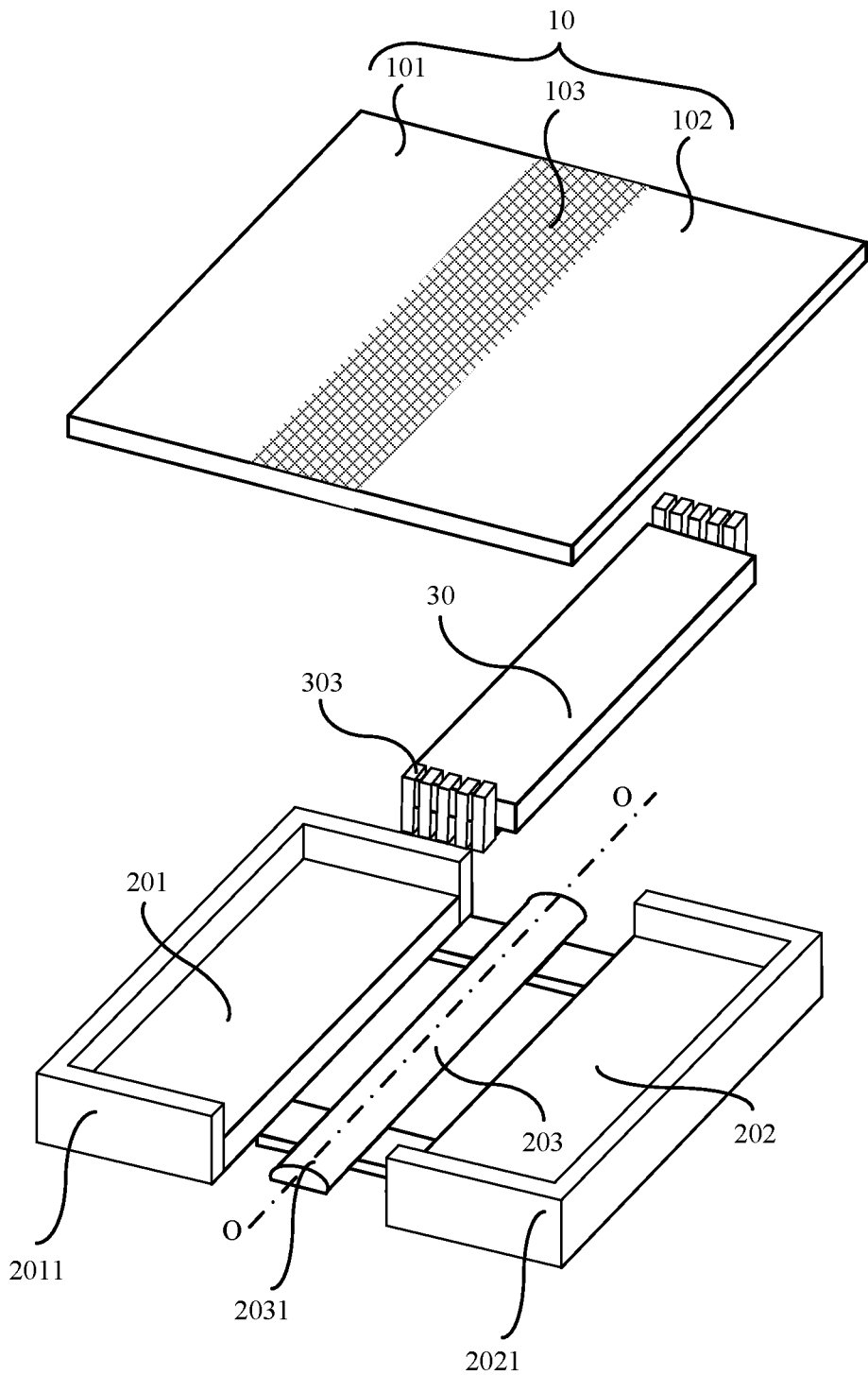
FIG. 3 is a schematic diagram of an exploded structure of another foldable display terminal according to an embodiment of this application.
Figure 3A:
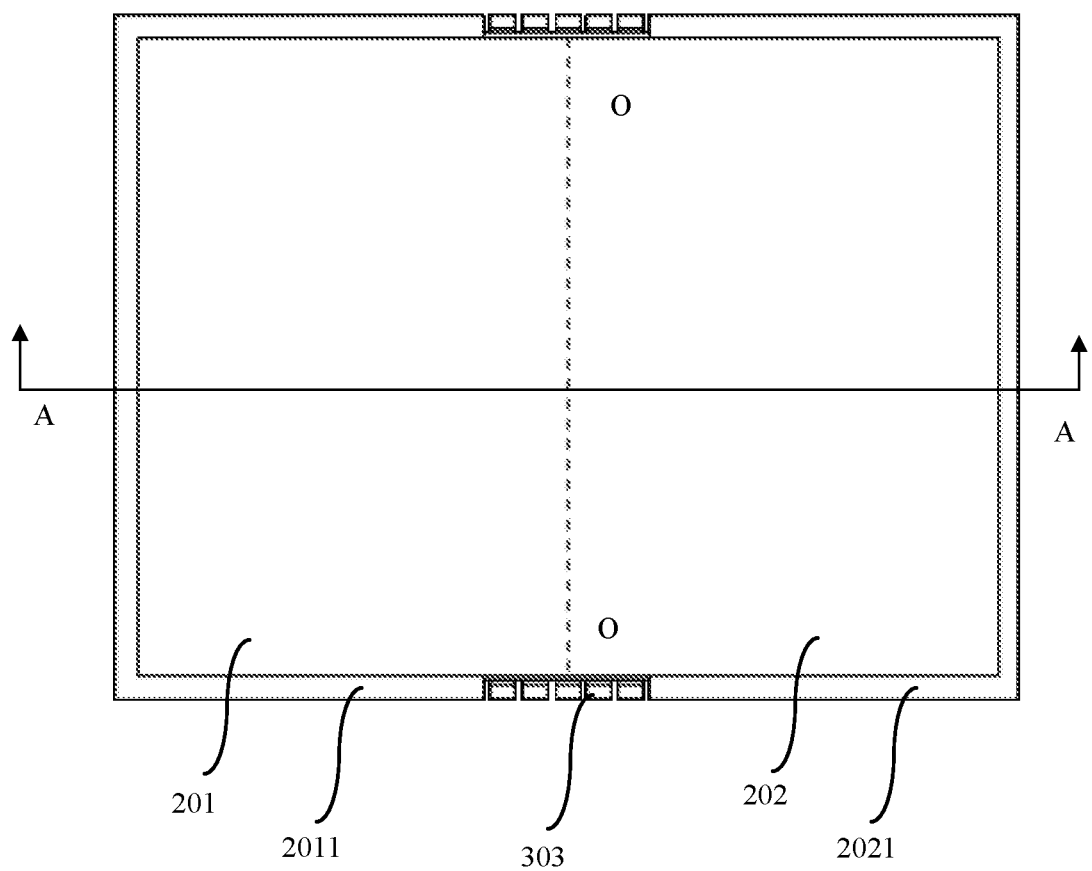
FIG. 3a is a top view of the foldable display terminal in FIG. 3.
Figure 3B:
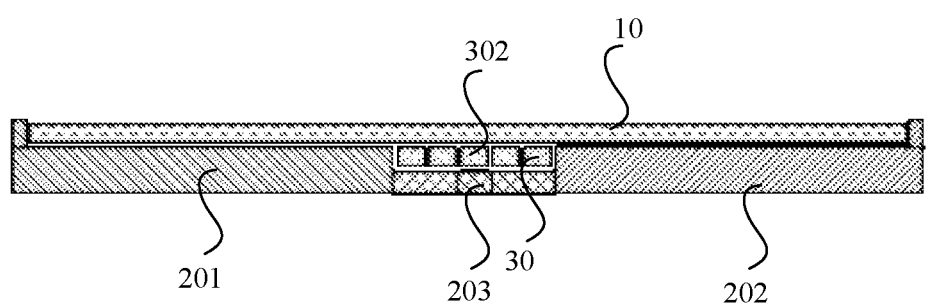
Figure 3C:
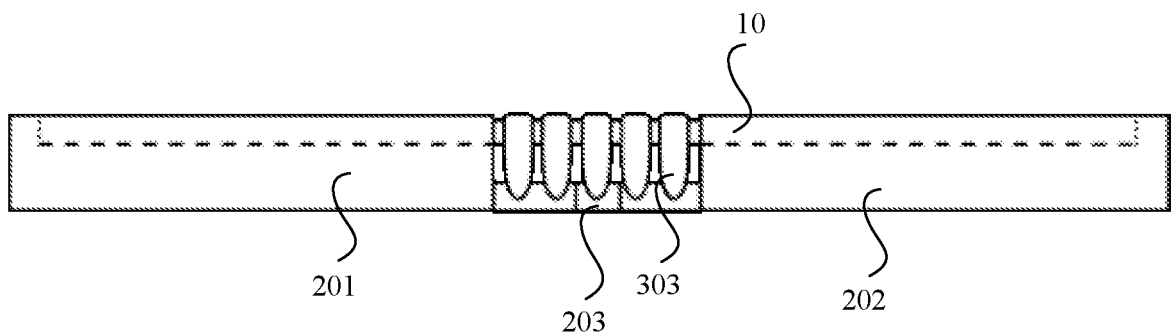
FIG. 3c is a front plan view of the foldable display terminal in FIG. 3.
Figure 6:
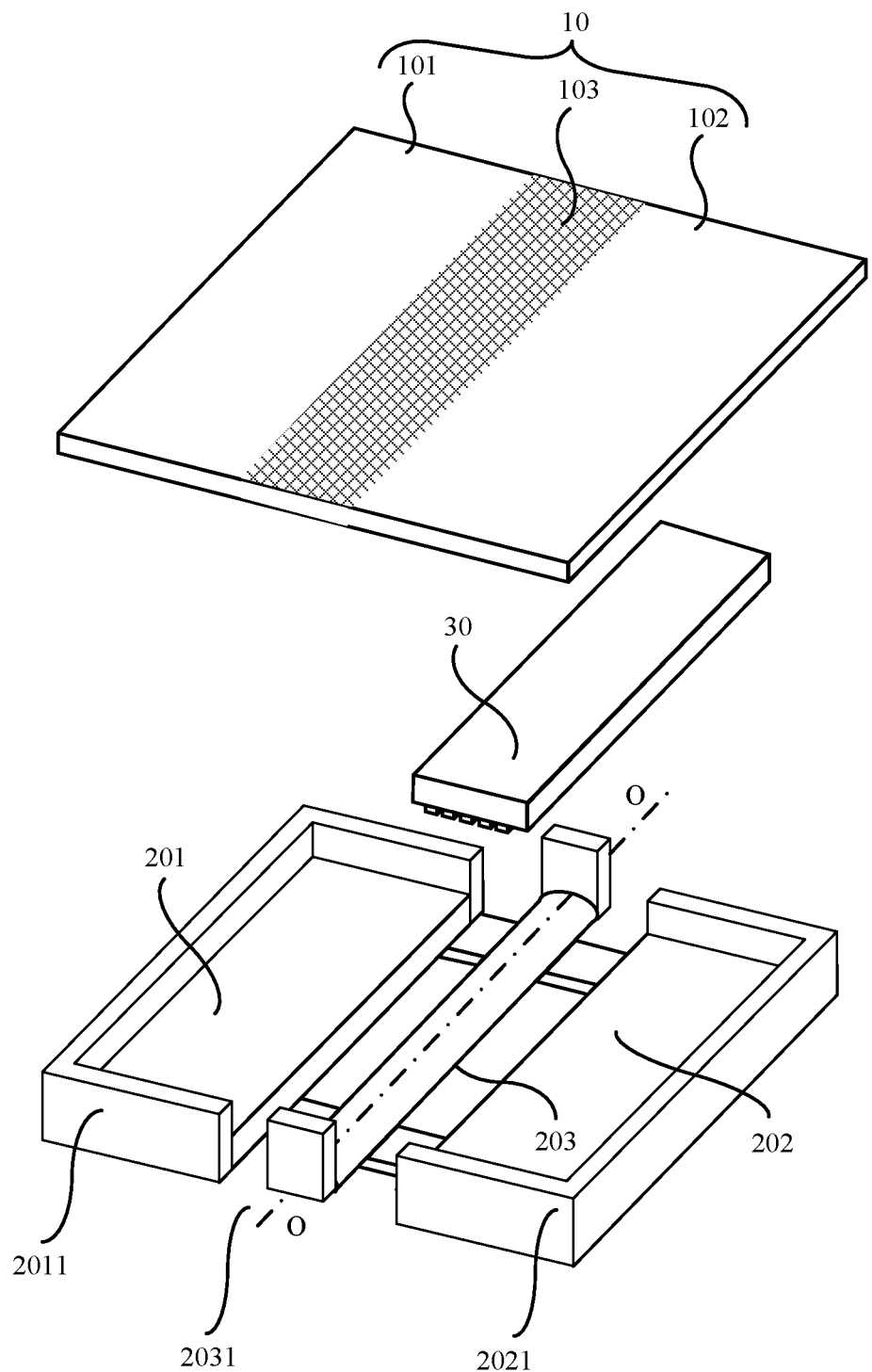
FIG. 6 is a schematic diagram of an exploded structure of another foldable display terminal according to an embodiment of this application.
Figure 6A:
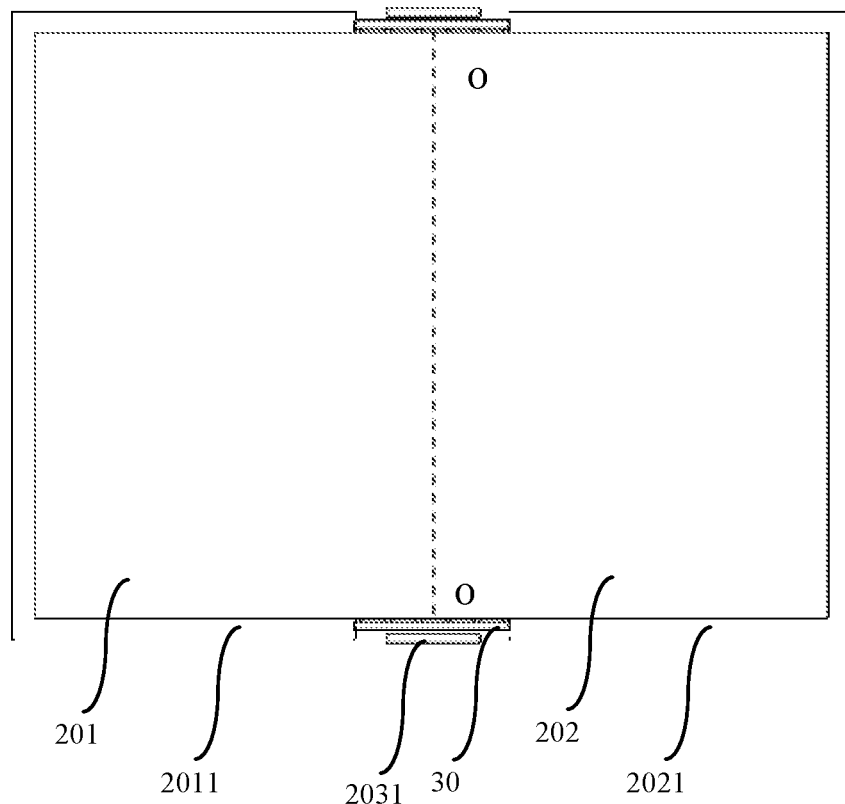
FIG. 6a is a top view of the foldable display terminal in FIG. 6.
Figure 6B:
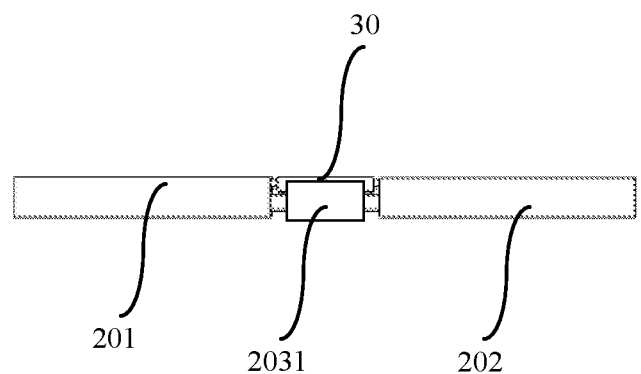
FIG. 6b is a front plan view of the foldable display terminal in FIG. 6.

In addition, as shown in FIG. 2, FIG. 3, and FIG. 6, a second protective structure 2011 may be further disposed on the end face that is of the first mechanical part 201 and that extends from the periphery of the flexible display 10, and a third protective structure 2021 may be disposed on an end face that is of the second mechanical part 202 and that extends from the periphery of the flexible display 10.

Therefore, the second protective structure and the third protective structure are disposed, to protect the periphery of the flexible display.

The second protective structure 2011 is higher than or flush with a surface that is of the flexible display and that is away from the first mechanical part 201. The third protective structure 2021 is higher than or flush with a surface that is of the flexible display and that is away from the second mechanical part.

Therefore, when the foldable display terminal falls or collides, the second protective structure and the third protective structure may be in contact with a point of collision earlier than the flexible display, to enhance protection of the flexible display, and further improve anti-collision performance of the foldable display terminal.

A connection manner of the second protective structure 2011 and the second mechanical part 202 and a connection manner of the third protective structure 2021 and the second mechanical part 202 are not limited in this embodiment of this application.

In an implementation of this application, a material of the second protective structure 2011 is the same as a material of the first mechanical part 201. The second protective structure 2011 and the first mechanical part 201 may be separately formed first, and then the second protective structure 2011 and the first mechanical part 201 are connected through welding.

Similarly, a material of the third protective structure 2021 is the same as the material of the second mechanical part 202. The third protective structure 2021 and the second mechanical part 202 may be separately formed first, and then the third protective structure 2021 and the second mechanical part 202 may be connected through welding.

In another implementation of this application, the second protective structure 2011 and the second mechanical part 202 are integrally formed. Therefore, connection strength of the second protective structure 2011 and the second mechanical part 202 can be improved, and the anti-collision performance of the foldable display terminal is further improved.

Similarly, the third protective structure 2021 and the second mechanical part 202 are integrally formed. Therefore, connection strength of the third protective structure 2021 and the second mechanical part 202 can be improved, and anti-collision performance of the foldable display terminal is further improved.

The material of the second protective structure 2011 and the material of the third protective structure 2021 are not limited in this embodiment of this application. For example, the material of the second protective structure 2011 and the material of the third protective structure 2021 include but are not limited to an aluminum alloy.

The second protective structure 2011 and the third protective structure 2021 may be formed through die-casting or obtained through numerical control machining.

Figure 10:
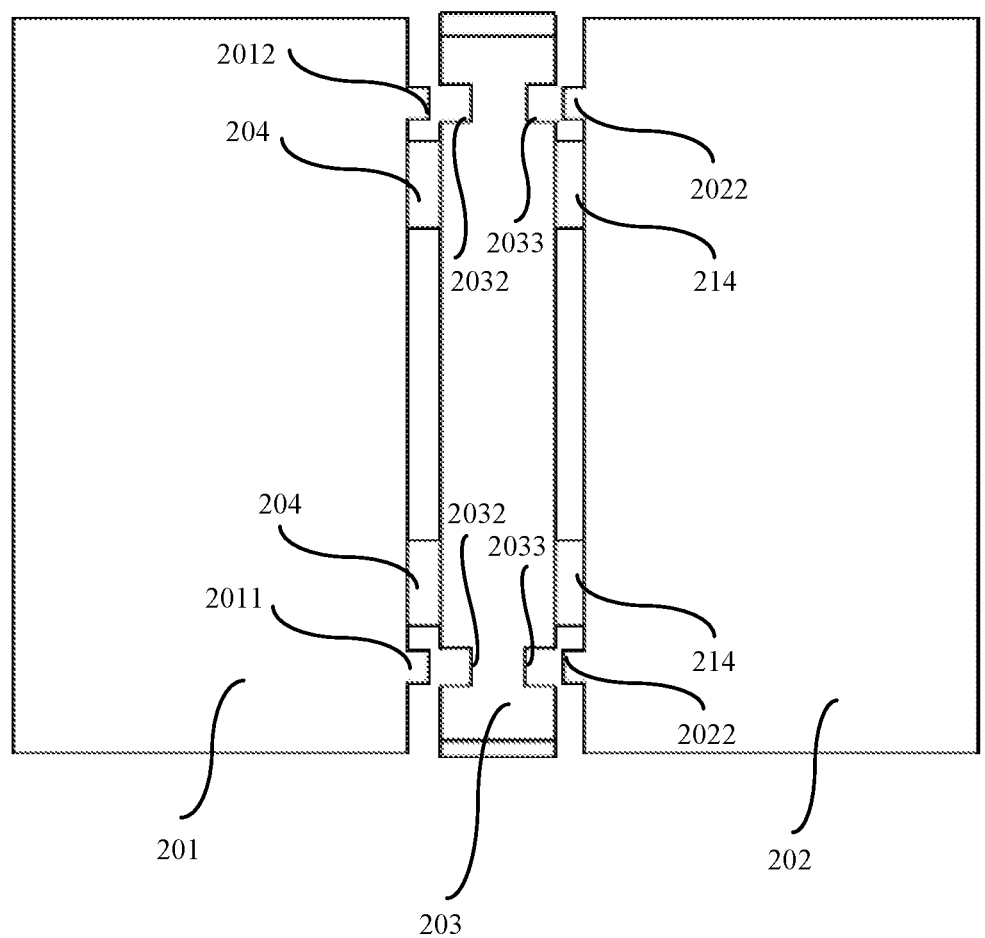
FIG. 10 is a schematic diagram of an exploded structure of another foldable display terminal according to an embodiment of this application.
Figure 11:
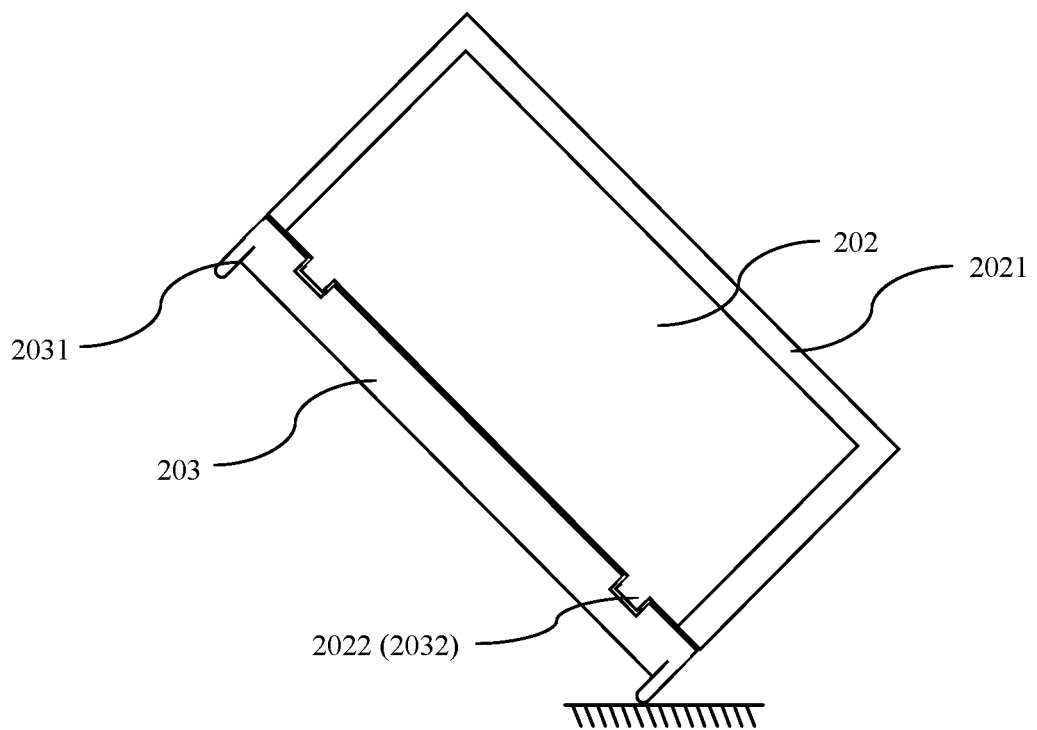
FIG. 11 is a schematic diagram of a falling state of a foldable display terminal in a folded state in FIG. 10.

To avoid a case in which the flexible display is damaged when the first mechanical part 201 and the second mechanical part 202 are dislocated relative to the rotating shaft 203 in a falling direction under impact of falling inertia, as shown in FIG. 10 and FIG. 11, the foldable assembly further includes a stop block.

The stop block includes a protrusion and a groove.

In an implementation of this embodiment of this application, the protrusion is disposed on the first mechanical part 201 and the second mechanical part 202, and the groove is disposed on the rotating shaft.

For example, as shown in FIG. 10 and FIG. 11, two first protrusions 2012 are disposed on the first mechanical part 201, and two first grooves 2032 matching the first protrusions 2012 are disposed on the rotating shaft. In the folded state, the first protrusion 2012 is located in the first groove 2032, to form a limiting structure, to prevent the first mechanical part 201 from being displaced and dislocated relative to the rotating shaft 203.

Similarly, two second protrusions 2022 are disposed on the second mechanical part 202, and two second grooves 2033 matching the second protrusions 2022 are disposed on the rotating shaft 203. In the folded state, the second protrusions 2022 are located in the second grooves 2033, to form a limiting structure, to prevent the second mechanical part 202 from being displaced and dislocated relative to the rotating shaft 203.

It should be noted that, a quantity of the stop blocks is not limited in this embodiment of this application. The stop block may include one or more groups of protrusions and grooves that match each other. A person skilled in the art may set a quantity of groups based on a requirement. All of these fall within the protection scope of this application.

In another implementation of this embodiment of this application, the groove is disposed on the first mechanical part 201 and the second mechanical part 202, and the protrusion is disposed on the rotating shaft. A specific structure is not described herein again.

Therefore, in the foldable assembly provided in this embodiment of this application, the first groove matches the first protrusion, and the second groove matches the second protrusion, so that when the foldable display terminal falls, displacement and dislocation amounts of displacement of the first mechanical part and the second mechanical part relative to the rotating shaft can be greatly reduced, and a case in which the flexible display is damaged by shear force exerted on the flexible display due to a fall of the foldable display terminal is avoided.

The limiting structure may be used to reduce the displacement and dislocation amount by 70%.

As shown in FIG. 10, the foldable assembly 20 further includes a third mechanical part 204 and a fourth mechanical part 214. The first mechanical part 201 is provided with a first sliding groove, and the second mechanical part 202 is provided with a second sliding groove.

The third mechanical part 204 and the fourth mechanical part 214 may be rotating parts of a cylindrical structure. Cross sections of the third mechanical part 204 and the fourth mechanical part 214 are, for example, circular or polygonal. Shapes of the cross sections of the third mechanical part and the fourth mechanical part are not limited in this embodiment of this application. A first end of the third mechanical part 204 is rotatably connected to the rotating shaft 203, and a second end may extend into the first sliding groove and be slidably connected to the first sliding groove. Therefore, when the first mechanical part 201 rotates around the axis O-O of the rotating shaft 203, relative to the third mechanical part 204, the first mechanical part 201 can slide by a preset distance in a direction close to or away from the rotating shaft 203.

Similarly, a first end of the fourth mechanical part 214 is rotatably connected to the rotating shaft 203, and a second end may extend into the second sliding groove and be slidably connected to the second sliding groove. Therefore, when the second mechanical part 202 rotates around the axis O-O of the rotating shaft 203, relative to the fourth mechanical part 214, the second mechanical part 202 can slide in the direction close to or away from the rotating shaft 203.

In this embodiment of this application, a connection manner of the third mechanical part 204 and the first sliding groove and a connection manner of the fourth mechanical part 214 and the second sliding groove are not limited, and only a sliding connection needs to be implemented.

In a folding process of the flexible display 10, the first mechanical part 201 slides in a direction close to the rotating shaft 203 relative to the third mechanical part 204, and the second mechanical part 202 slides in the direction close to the rotating shaft 203 relative to the fourth mechanical part 214. Therefore, the first mechanical part 201 can slide relative to the third mechanical part 204, and the second mechanical part 202 can slide relative to the fourth mechanical part 214, to release a part of bending force, reduce a pulling force exerted on the flexible display, and avoid too large pulling force exerted on the flexible display in the folding process.

In an unfolding process of the flexible display 10, the first mechanical part 201 slides in a direction away from the rotating shaft 203 relative to the third mechanical part 204, and the second mechanical part 202 slides in the direction away from the rotating shaft 203 relative to the fourth mechanical part 214. Therefore, the first mechanical part 201 can slide relative to the third mechanical part 204, and the second mechanical part 202 can slide relative to the fourth mechanical part 214, to release a part of unfolding force, reduce a pulling force exerted on the flexible display, and avoid too large pulling force exerted on the flexible display in the unfolding process.

In a rotating structure provided in this embodiment of this application, the third mechanical part is slidably connected to the first mechanical part, and the fourth mechanical part is slidably connected to the second mechanical part, to reduce pulling force exerted by the first mechanical part, the second mechanical part, and the rotating shaft on the flexible display, and improve flatness of the flexible display.

The foregoing description is merely a specific implementation of this application, but is not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A foldable assembly configured to bear and includes a flexible display, comprises:
   a rotating shaft and a plurality of support bars disposed axially around the rotating shaft;
   a first mechanical part and a second mechanical part, wherein the first mechanical part and the second mechanical part are rotatably connected to the rotating shaft; and
   a single first protective structure extends from each end of the rotating shaft forming an "L" shape with the rotating shaft which extends beyond each end of the flexible display and having a width that matches the rotating shaft, whereby the first protective structure is configured to provide additional protection when the flexible display is dropped.

2. The foldable assembly according to claim 1, wherein a material of the first protective structure is stainless steel, die steel, or an amorphous alloy.

3. The foldable assembly according to claim 1, wherein the first protective structure and the rotating shaft are integrally formed.

4. The foldable assembly according to claim 1, further comprising a second protective structure and a third protective structure, wherein
   the second protective structure is connected to an end face that is of the first mechanical part and that extends out of the periphery of the flexible display, and the second protective structure is higher than or flush with the first surface of the flexible display; and
   the third protective structure is connected to an end face that is of the second mechanical part and that extends out of the periphery of the flexible display, and the third protective structure is higher than or flush with the first surface of the flexible display.

5. The foldable assembly according to claim 4, wherein the second protective structure and the first mechanical part are integrally formed, and the third protective structure and the second mechanical part are integrally formed.

6. The foldable assembly according to claim 4, wherein a material of each of the second protective structure and the third protective structure is an aluminum alloy.

7. The foldable assembly according to claim 1, further including a bent region support comprises a flexible connection layer and a plurality of spaced rigid support bars disposed along an axis direction of the rotating shaft; the rigid support bar is connected to the flexible connection layer; and the flexible connection layer is connected to a bent region of the flexible display by using an adhesive layer.

8. The foldable assembly according to claim 7, wherein an elastic component is disposed between an end face of the bent region support and the first protective structure.

9. The foldable assembly according to claim 1, wherein
   a first protrusion is disposed on the first mechanical part, a first groove matching the first protrusion is disposed on the rotating shaft, and the first protrusion is located in the first groove; and
   a second protrusion is disposed on the second mechanical part, a second groove matching the second protrusion is disposed on the rotating shaft, and the second protrusion is located in the second groove.

10. The foldable assembly according to claim 1, further comprising:
    a third mechanical part, wherein the first mechanical part is provided with a first sliding groove, a first end of the third mechanical part is connected to the rotating shaft, and a second end of the third mechanical part is disposed in the first sliding groove; and
    a fourth mechanical part, wherein the second mechanical part is provided with a second sliding groove, a first end of the fourth mechanical part is connected to the rotating shaft, and a second end of the fourth mechanical part is disposed in the second sliding groove.

11. The foldable display terminal according to claim 1, wherein the first protective structure and the rotating shaft are integrally formed.

12. A foldable display terminal, comprising a flexible display and a foldable assembly, wherein
    a first non-bent area of the flexible display is connected to a first mechanical part in the foldable assembly;
    a second non-bent area of the flexible display is connected to a second mechanical part in the foldable assembly;
    a bent area of the flexible display is connected to a bent region support in the foldable assembly;
    the bent area is located between the first non-bent area and the second non-bent area;
    wherein the foldable assembly is configured to bear a flexible display, and the foldable assembly comprises:

a rotating shaft and a plurality of support bars disposed axially around the rotating shaft;

a first mechanical part and a second mechanical part, wherein the first mechanical part and the second mechanical part are rotatably connected by using the rotating shaft; and a single first protective structure extends from each end of the rotating shaft forming an "L" shape with the rotating shaft which extends beyond each end of the flexible display and having a width that matches the rotating shaft, whereby the first protective structure is configured to provide additional protection when the flexible display is dropped.

13. The foldable display terminal according to claim 12, wherein a material of the first protective structure is stainless steel, die steel, or an amorphous alloy.

14. The foldable display terminal according to claim 12, further comprising a second protective structure and a third protective structure, wherein the second protective structure is connected to an end face that is of the first mechanical part and that extends out of the periphery of the flexible display, and the second protective structure is higher than or flush with the first surface of the flexible display; and the third protective structure is connected to an end face that is of the second mechanical part and that extends out of the periphery of the flexible display, and the third protective structure is higher than or flush with the first surface of the flexible display.

15. The foldable display terminal according to claim 14, wherein the second protective structure and the first mechanical part are integrally formed, and the third protective structure and the second mechanical part are integrally formed.

16. The foldable display terminal according to claim 14, wherein a material of each of the second protective structure and the third protective structure is an aluminum alloy.

17. The foldable display terminal according to claim 12, further including a bent region support comprises a flexible connection layer and a plurality of spaced rigid support bars disposed along an axis direction of the rotating shaft; the rigid support bar is connected to the flexible connection layer; and the flexible connection layer is connected to a bent region of the flexible display by using an adhesive layer.

18. The foldable display terminal according to claim 17, wherein an elastic component is disposed between an end face of the bent region support and the first protective structure.

19. The foldable display terminal according to claim 12, wherein a first protrusion is disposed on the first mechanical part, a first groove matching the first protrusion is disposed on the rotating shaft, and the first protrusion is located in the first groove; and a second protrusion is disposed on the second mechanical part, a second groove matching the second protrusion is disposed on the rotating shaft, and the second protrusion is located in the second groove.

20. The foldable display terminal according to claim 12, further comprising:

a third mechanical part, wherein the first mechanical part is provided with a first sliding groove, a first end of the third mechanical part is connected to the rotating shaft, and a second end of the third mechanical part is disposed in the first sliding groove; and a fourth mechanical part, wherein the second mechanical part is provided with a second sliding groove, a first end of the fourth mechanical part is connected to the rotating shaft, and a second end of the fourth mechanical part is disposed in the second sliding groove.

21. A foldable display terminal, comprising:

a communication terminal comprising a foldable display; and a housing to securely holding and protecting the foldable display, the housing comprising:

a rotating shaft and a plurality of support bars disposed axially around the rotating shaft;

a first mechanical part and a second mechanical part, wherein the first mechanical part and the second mechanical part are rotatably connected to the rotating shaft and are each configured to securely hold opposite ends of the foldable display; and a single first protective structure extends from each end of the rotating shaft forming an "L" shape with the rotating shaft which extends beyond each end of the flexible display and having a width that matches the rotating shaft, whereby the first protective structure is configured to provide additional protection when the flexible display is dropped.

22. The foldable assembly according to claim 21, wherein a material of the protective structure is stainless steel, die steel, or an amorphous alloy.

23. The foldable assembly according to claim 21, wherein the protective structures and the rotating shaft are integrally formed.

* * * * *